United States Patent
Kataoka et al.

(10) Patent No.: US 9,756,718 B2
(45) Date of Patent: Sep. 5, 2017

(54) MODULE BOARD

(71) Applicant: Murata Manufacturing Co., Ltd., Kyoto (JP)

(72) Inventors: Yuji Kataoka, Kyoto (JP); Koichi Kanryo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 348 days.

(21) Appl. No.: 14/160,962

(22) Filed: Jan. 22, 2014

(65) Prior Publication Data

US 2014/0204550 A1  Jul. 24, 2014

(30) Foreign Application Priority Data

Jan. 22, 2013 (JP) ................... 2013-009535

(51) Int. Cl.
  *H05K 1/02* (2006.01)
  *H05K 3/28* (2006.01)
  *H01L 23/00* (2006.01)

(52) U.S. Cl.
  CPC ........... *H05K 1/0216* (2013.01); *H01L 24/97* (2013.01); *H05K 1/0218* (2013.01); *H05K 3/284* (2013.01); *H01L 2224/16225* (2013.01); *H01L 2924/15787* (2013.01); *H01L 2924/19105* (2013.01); *H05K 2201/0245* (2013.01); *H05K 2201/0323* (2013.01); *H05K 2201/0715* (2013.01); *H05K 2203/1316* (2013.01)

(58) Field of Classification Search
  CPC ........................... H05K 1/0216; H05K 1/0218
  USPC ........................................................ 174/520
  See application file for complete search history.

(56) References Cited

U.S. PATENT DOCUMENTS 7,382,628 B2 *  6/2008  Kawamoto ............ H05K 3/284
                                                174/257

FOREIGN PATENT DOCUMENTS

| CN | 101211898 A | 7/2008 |
|----|----|----|
| JP | 62-144558 A | 6/1987 |
| JP | S63-239707 A | 10/1988 |
| JP | 64-089584 A | 4/1989 |
| JP | H06-251620 A | 9/1994 |
| JP | 10-27986 A | 1/1998 |
| JP | 11-060969 A | 3/1999 |
| JP | 11060969 A * | 3/1999 |
| JP | 2004-172176 A | 6/2004 |
| JP | 2004-207352 A | 7/2004 |

(Continued)

OTHER PUBLICATIONS

Office Action in corresponding Japanese Patent Application No. 2013-009535 dated Jul. 14, 2015.

(Continued)

*Primary Examiner* — Courtney Smith
*Assistant Examiner* — Jessey R Ervin
(74) *Attorney, Agent, or Firm* — Pearne & Gordon, LLP

(57) ABSTRACT

A module board includes a base substrate. Electronic components are mounted on a first principal surface of the base substrate. The mounted electronic components are sealed by a sealing resin containing an $SiO_2$ filler. A top surface and side surfaces of the sealing resin are covered with a shield layer containing a carbon filler, which is flat powder, as a conductive component. A terminal electrode is formed on a second principal surface of the base substrate that is disposed opposite to the first principal surface of the base substrate.

6 Claims, 4 Drawing Sheets

(56) References Cited

FOREIGN PATENT DOCUMENTS

| JP | 2006294701 A | * | 10/2006 | | |
|---|---|---|---|---|---|
| JP | 2009-277736 A | | 11/2009 | | |
| JP | 2010-080826 A | | 4/2010 | | |
| JP | WO 2012010185 A1 | * | 8/2012 | ........... | H01L 21/561 |
| JP | 2012-227444 A | | 11/2012 | | |
| WO | 2012/101857 A1 | | 8/2012 | | |

OTHER PUBLICATIONS

Office Action issued in corresponding Japanese Patent Application No. 2013-009535 dated Jan. 13, 2015.

Notice of Reasons for Rejection issued in Japense Patent Application No. 2013-009535 dated Mar. 15, 2016.

* cited by examiner

MODULE BOARD

BACKGROUND OF THE INVENTION

1. Field of the Invention

The present invention relates to a module board. More particularly, the present invention relates to, for example, a module board of a circuit module or the like in which a sealing resin is covered with a shield layer. The sealing resin is formed so as to seal an electronic component mounted on one of the principal surfaces of a base substrate.

2. Description of the Related Art

An example of a circuit module of a related art, serving as a background of the invention, is disclosed in, for example, Japanese Unexamined Patent Application Publication No. 2004-172176 (Patent Document 1). The circuit module disclosed in Patent Document 1 is one in which a component that is disposed on a substrate is covered with an insulating layer. This circuit module includes a shield layer connected to a ground electrode provided on the substrate. In the circuit module, the shield layer is formed of a conductive resin and, in general, a filler, such as Ag or Cu, is used as a conductive component of the conductive resin.

As in the circuit module that is disclosed in Patent Document 1, the shield layer using a filler, such as Ag or Cu, provides good shield characteristics with respect to external interfering waves. However, the shield layer interferes with the component disposed on the substrate and causes the circuit module characteristics to be deteriorated. An example of such a case is when the shield layer and the component disposed on the substrate of the circuit module constitute a capacitor together with the resin serving as a dielectric existing therebetween.

BRIEF SUMMARY OF THE INVENTION

Accordingly, it is a primary object of the present invention to provide a module board that can suppress the interference between a shield layer and an electronic component mounted on a base substrate and that can improve the module characteristics.

According to preferred embodiments of the present invention, a module board includes a base substrate, an electronic component mounted on one of principal surfaces of the base substrate, a sealing resin formed so as to seal the electronic component mounted on the one of the principal surfaces of the base substrate, and a shield layer covering the sealing resin. The shield layer is a resin film containing carbon as a conductive component.

According to preferred embodiments of the present invention, in the module board, it is desirable that the sealing resin contain an $SiO_2$ filler.

According to preferred embodiments of the present invention, in the module board, it is desirable that a coefficient of linear expansion of the shield layer be about 1 to 15 ppm/° C., and a coefficient of linear expansion of the sealing resin be about 5 to 20 ppm/° C.

According to preferred embodiments of the present invention, in the module board, it is desirable that the carbon be flat powder.

According to preferred embodiments of the present invention, it is desirable that the module board further includes a shield section containing a metal and provided so as to contact with a portion of the shield layer.

According to preferred embodiments of the present invention, in the module board, since the shield layer is a resin film containing carbon as a conductive component, and the carbon that is contained in the shield layer has a conductivity that is lower than the conductivities of Ag and Cu, it is possible to suppress the interference between the shield layer and the electronic component mounted on the one of the principal surfaces of the base substrate and to improve the module characteristics.

According to preferred embodiments of the present invention, in the module board, since the shield layer is a resin film containing carbon as a conductive component, it is possible to easily form the shield layer.

According to preferred embodiments of the present invention, in the module board, since the thermal expansion coefficient of the carbon contained in the shield layer is closer to the thermal expansion coefficient of the sealing resin compared to the thermal expansion coefficients of Ag and Cu, it is possible to increase the adhesion strength between the shield layer and the sealing resin.

According to preferred embodiments of the present invention, in the module board, since the density of the carbon contained in the shield layer is lower than the densities of Ag and Cu, it is possible to reduce the weight of the shield layer or the weight of the module board, so that the mechanical strength of the module board against falls can be increased.

According to preferred embodiments of the present invention, in the module board, since the cost of the carbon that is contained in the shield layer is lower than the costs of Ag and Cu, it is possible to reduce the cost of the module board.

According to preferred embodiments of the present invention, in the module board, when the sealing resin contains an $SiO_2$ filler, the coefficient of linear expansion of the carbon that is contained in the shield layer and the coefficient of linear expansion of the $SiO_2$ filler contained in the sealing resin are close to each other, so that it is possible to increase the adhesion between the shield layer and the sealing resin. For example, in the module board, when the coefficient of linear expansion of the shield layer is about 1 to 15 ppm/° C. and the coefficient of linear expansion of the sealing resin is about 5 to 20 ppm/° C., the coefficient of linear expansion of the shield layer and the coefficient of linear expansion of the sealing resin are close to each other, so that it is possible to increase the adhesion between the shield layer and the sealing resin.

According to preferred embodiments of the present invention, in the module board, when the carbon that is contained in the shield layer is flat powder, the adhesion between carbon and carbon is increased, so that the shield performance of the shield layer is enhanced. Therefore, it is possible to provide even better shield characteristics with respect to external interfering waves.

According to preferred embodiments of the present invention, it is possible to provide a module board that can suppress the interference between the shield layer and the electronic component mounted on the base substrate and that can improve the module characteristics.

The aforementioned object, other objects, other features, elements, characteristics and advantages of the present invention will become more apparent from the following detailed description of a preferred embodiment of the present invention with reference to the attached drawings.

DETAILED DESCRIPTION OF THE INVENTION

Embodiment

Figure 1:
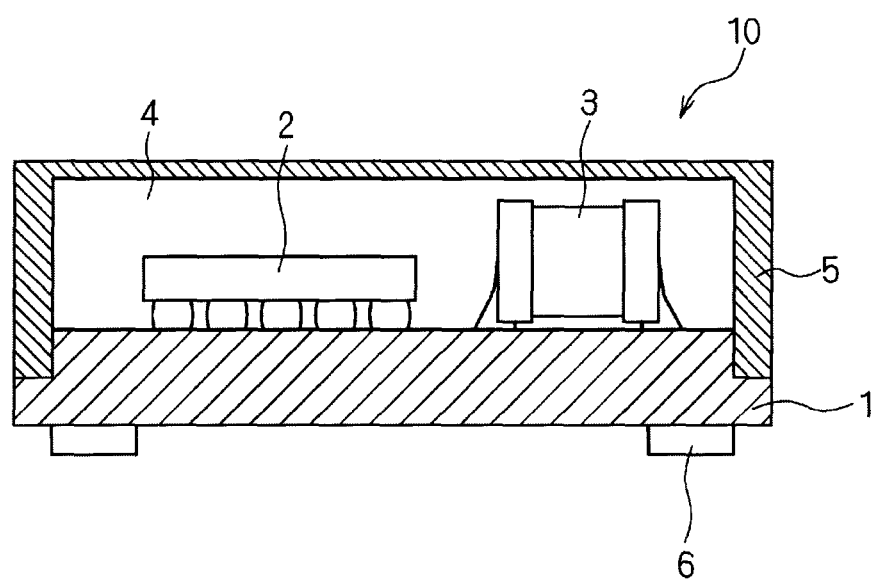
FIG. 1 is a schematic view showing an exemplary structure of a module board according to an embodiment of the present invention.

FIG. 1 is a schematic view showing a structure of a module board 10 according to an embodiment of the present invention. As shown in FIG. 1, the module board 10 includes a base substrate 1, a plurality of electronic components 2 and 3 mounted on one of the principal surfaces (the first principal surface) of the base substrate 1, a sealing resin 4 formed so as to seal the plurality of the mounted electronic components 2 and 3, a shield layer 5 covering a top surface and side surfaces of the sealing resin 4 with a conductive material, and a terminal electrode 6 formed on the other principal surface (the second principal surface) of the base substrate 1. The second principal surface is disposed opposite to the first principal surface on which the electronic components 2 and 3 are mounted.

From the viewpoint of the material, the base substrate 1 includes, but is not limited to, an organic substrate or a ceramic substrate such as a low temperature co-fired ceramic (LTCC) substrate. From the viewpoint of the function, the base substrate 1 includes, but is not limited to, a printed circuit substrate or a flexible substrate. A surface electrode (not shown) is formed on the first principal surface of the base substrate 1 on which the electronic components 2 and 3 are to be mounted. The electronic component 2 is an integrated circuit (IC) that is mountable on the first principal surface of the base substrate 1. The integrated circuit (IC) is an electronic component whose characteristics change by the influence of external electromagnetic waves. The electronic component 3 is a surface mount device that is capable of being surface-mounted to the first principal surface of the base substrate 1.

Since the sealing resin 4 is an insulating material made up of, for example, epoxy resin, the insulation between the electronic components 2 and 3 mounted on the first principal surface of the base substrate 1 is improved. The sealing resin 4 contains an $SiO_2$ filler. The shield layer 5 is formed of a conductive material made up of phenol resin or epoxy resin containing carbon filler that is flat powder. The terminal electrode 6 is an electrode for connecting the module board 10 to another board.

Figure 2A:
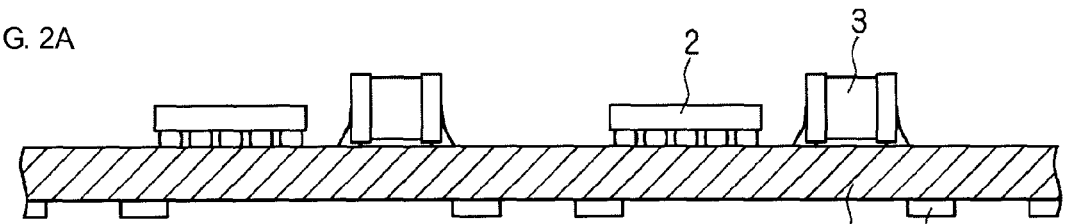
FIGS. 2A to 2E are schematic views illustrating the steps of manufacturing the module board according to the embodiment of the present invention.

FIGS. 2A to 2E are schematic views illustrating the steps of manufacturing the module board 10 according to the embodiment of the present invention shown in FIG. 1. First, as shown in FIG. 2A, electronic components 2 and 3 are mounted on a surface electrode (not shown) at a first principal surface of an aggregate substrate 100.

Figure 2B:
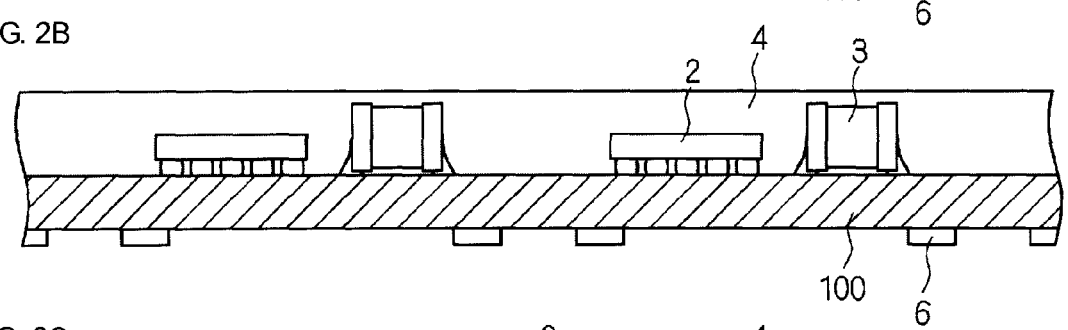

Next, as shown in FIG. 2B, a sealing resin 4 that seals the electronic components 2 and 3 mounted on the first principal surface of the aggregate substrate 100 is formed. More specifically, the sealing resin 4 may be formed by applying a liquid resin containing a hardener and an $SiO_2$ filler to the aggregate substrate 100 on which the electronic components 2 and 3 are mounted and by hardening the applied resin after defoaming. Instead of the liquid resin, it is possible to place a solid resin, a granular resin, or a sheet resin on the aggregate substrate 100 on which the electronic components 2 and 3 are mounted, and heat the solid resin, the granular resin, or the sheet resin.

Figure 2C:
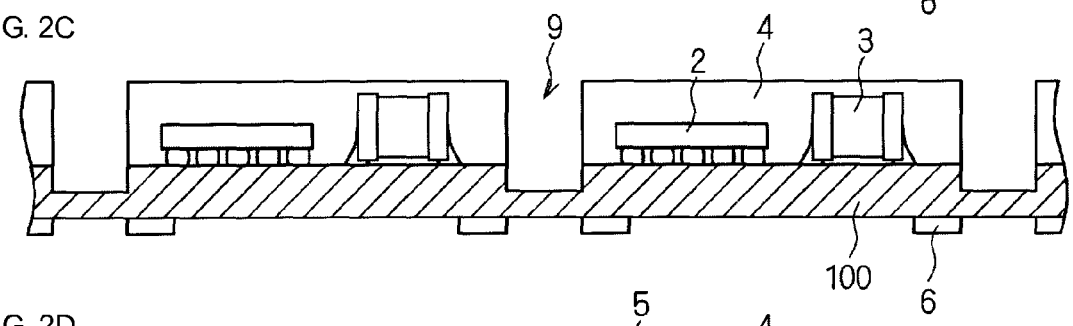

Next, as shown in FIG. 2C, using, for example, a dicer, a groove 9 is formed from a top surface of the sealing resin 4 to a portion of the aggregate substrate 100. Even if the groove 9 is formed, portions of two base substrates 1 that are adjacent to each other (aggregate substrate 100) are connected to each other. The width of the groove 9 is, for example, about 300 mm.

Figure 2D:
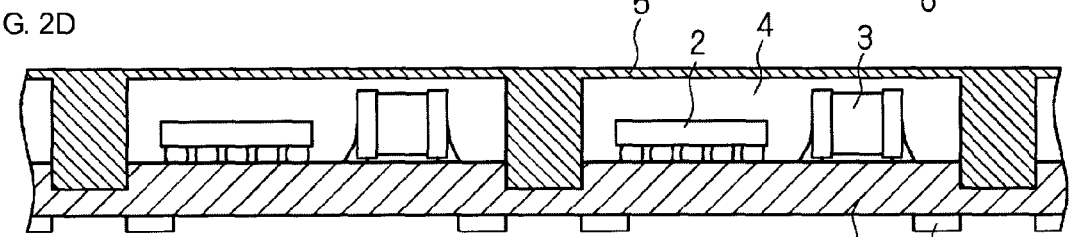

Next, as shown in FIG. 2D, using, for example, a dispenser, a jet dispenser, or a vacuum printing device, a conductive material is applied so as to cover the groove 9 and the top surface of the sealing resin 4 that has sealed the electronic components 2 and 3, and the conductive material is hardened, so that a shield layer 5 is formed. Although not shown, by electrically connecting the shield layer 5 and a ground electrode that is exposed from the aggregate substrate 100, it is possible to ensure the electrical shield performance of the shield layer 5 with respect to the mounted electronic components 2 and 3. The conductive material is made up of for example, about 80 wt % of carbon filler, about 10 wt % of epoxy resin, about 5 wt % of diluent, and about 5 wt % of other substances; or about 86 wt % of carbon filler, about 8 wt % of epoxy resin, about 4 wt % of diluent, and about 2 wt % of other substances. Here, the conductivity of carbon filler in the conductive material is about $3 \times 10^{-2}$ Ω·cm, which is less than the conductivity of a general Ag filler (which is of the order of about $10^{-4}$ to $10^{-5}$ Ω·cm). When the conductive material is applied using a mesh screen, if the thickness of the mesh screen is, for example, about 20 mm, it is possible to form a shield layer 5 having a thickness of about 20 mm on the top surface of the sealing resin 4. The specification of the mesh screen is, for example, a plain-woven mesh screen, an emulsion thickness of about 26 mm, an opening length of about 82 mm, a wire diameter of about 20 mm, and about 250 meshes.

Methods of applying a conductive material so as to cover the groove 9 and the top surface of the sealing resin 4 that has sealed the electronic components 2 and 3 include, but are not limited to, printing, such as vacuum printing, so that any other method may be used. Examples thereof include spin coating, dipping, bonding, and dispensing.

Alternatively, the conductive material may contain a solvent in the aforementioned compositions. Still alternatively, the conductive material may contain phenol resin in place of or together with epoxy resin.

Figure 2E:
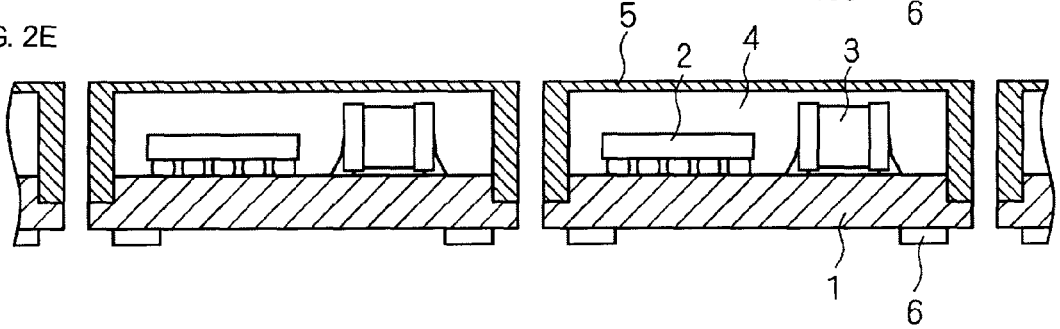

Next, as shown in FIG. 2E, using, for example, a dicer, the shield layer 5 in which the groove 9 is formed is cut from the top surface side of the sealing resin 4 to a position where the whole aggregate substrate 100 is cut, so that the aggregate substrate 100 is divided into a plurality of module boards 10. It is desirable that the thickness of a portion of the shield layer 5 that is formed on the top surface of the sealing resin 4 be about 5 mm to 50 mm and that the thickness of portions of the shield layer 5 that are formed at the side surfaces of the sealing resin 4 be about 50 mm to 150 mm.

In the module board 10 shown in FIG. 1, the shield layer 5 is a resin film containing carbon filler as a conductive component. The conductivity of the carbon filler that is contained in the shield layer 5 is lower than the conductivities of an Ag filler and a Cu filler. Therefore, it is possible to suppress the interference between the shield layer 5 and the electronic components 2 and 3 mounted on the first principal surface of the base substrate 1 and to improve the module characteristics.

Here, a module board of a related art shielded by a shield layer containing an Ag filler and epoxy resin, and a module board 10 according to the above-described embodiment shielded by a shield layer 5 containing a carbon filler and epoxy resin were formed. Then, the characteristics of these module boards were measured.

In the module board of the related art shielded by the shield layer containing the Ag filler, the radiation from an IC is traveled around a peripheral circuit via the shield layer, as a result of which normal characteristics were not obtained.

In contrast, in the module board 10 according to the above-described embodiment shielded by the shield layer 5 containing the carbon filler, since the resistance value of the shield layer 5 was high, normal characteristics were obtained.

The resistance value here in the module board of the related art (for example, the resistance value measured between two points separated by about 10 mm by a four terminal method) was about 0.7Ω. In contrast, the resistance value in the module board 10 according to the above-described embodiment measured in the same way was about 80Ω.

In the module board 10, since the shield layer 5 is a resin film containing carbon filler as a conductive component, it is possible to easily form the shield layer 5.

Further, in the module board 10, the thermal expansion coefficient of the carbon filler contained in the shield layer 5 is closer to the thermal expansion coefficient of the sealing resin 4 compared to those of an Ag filler and a Cu filler. Therefore, it is possible to increase the adhesion strength between the shield layer 5 and the sealing resin 4.

In the module board 10, since the sealing resin 4 contains an $SiO_2$ filler, the coefficient of linear expansion of the carbon filler that is contained in the shield layer 5 and the coefficient of linear expansion of the $SiO_2$ filler that is contained in the sealing resin 4 are close to each other, so that it is possible to increase the adhesion between the shield layer 5 and the sealing resin 4. In the module board 10, the coefficient of linear expansion of the shield layer 5 is substantially in the range of from 1 to 15 ppm/° C., and the coefficient of linear expansion of the sealing resin 4 is substantially in the range of from 5 to 20 ppm/° C. The coefficient of linear expansion of the shield layer 5 and the coefficient of linear expansion of the sealing resin 4 are close to each other, so that it is possible to increase the adhesion between the shield layer 5 and the sealing resin 4.

Here, a plurality of about −10-mm-square module boards of a related art using a resin base substrate and shielded by a shield layer containing an Ag filler, and a plurality of about −10-mm-square module boards 10 according to the above-described embodiment using a resin base substrate and shielded by a shield layer 5 containing a carbon filler were formed. These module boards were tested in a heat cycle of about −40° C. to 85° C. while they were mounted on a printed board.

At about 400 cycles, peeling started to occur at an interface between the resin base substrate and the shield layer in some of the module boards corresponding to that of the related art, and, at about 600 cycles, peeling had occurred in all of the module boards of the related art.

In contrast, peeling started to occur in some of the module boards 10 according to the above-described embodiment from about 800 cycles, and peeling had not occurred in some of the module boards 10 even at about 1000 cycles.

This is due to the difference between the coefficient of linear expansion of the shield layer and the coefficient of linear expansion of the sealing resin.

The coefficient of linear expansion of Ag filler is about 19.7 ppm/° C. and the coefficient of linear expansion of Cu filler is about 17 ppm/° C., whereas the coefficient of linear expansion of carbon filler is low at about 0.6 to 4.3 ppm/° C. Accordingly, the coefficient of linear expansion of the shield layer 5 containing carbon filler also becomes small, so that it is possible to bring the coefficient of linear expansion of the shield layer 5 close to the coefficient of linear expansion of the sealing resin 4 containing $SiO_2$ filler, the coefficient of linear expansion of $SiO_2$ being about 2 to 3 ppm/° C. Therefore, the adhesion strength between the shield layer 5 and the sealing resin 4 is high with regard to the heat history of heat cycles or the like and during reflow soldering for the module boards 10.

In each module board 10, the density of carbon filler contained in the shield layer 5 is about 2.2 $g/cm^3$, and is low compared with the density of Ag filler that is about 19.3 $g/cm^3$ and the density of Cu filler that is about 8.9 $g/cm^3$. This makes it possible to reduce the weight of the shield layer 5 or the weight of each module board 10, so that the mechanical strength of each module board 10 against falls can be increased.

Further, in each module board 10, since the cost of carbon filler contained in the shield layer 5 is lower than the costs of Ag filler and Cu filler, it is possible to reduce the cost of each module board 10.

In each module board 10, the carbon filler that is contained in the shield layer 5 is flat powder, so that the adhesion between carbon fillers increase, as a result of which the shield performance of the shield layer 5 is enhanced. Therefore, it is possible to provide even better shield characteristics with respect to external interfering waves. Even if the carbon filler contained in the shield layer 5 is in a form other than flat powder, such as in the form of powder or grains, it is possible to provide good shield characteristics.

Although, in the above-described embodiment, an integrated circuit and a surface mount electronic component are used as electronic components, other electronic components, such as electronic components with lead wires, may be used in the present invention.

In order to manufacture the module board 10 shown in FIG. 1, after the sealing resin 4 has been formed as shown in FIG. 2B, the sealing resin 4 and the aggregate substrate 100 are divided for forming a plurality of modules 10. Then, a shield layer 5 is formed on the top surface and the side surfaces of the sealing resin 4.

Figure 3:
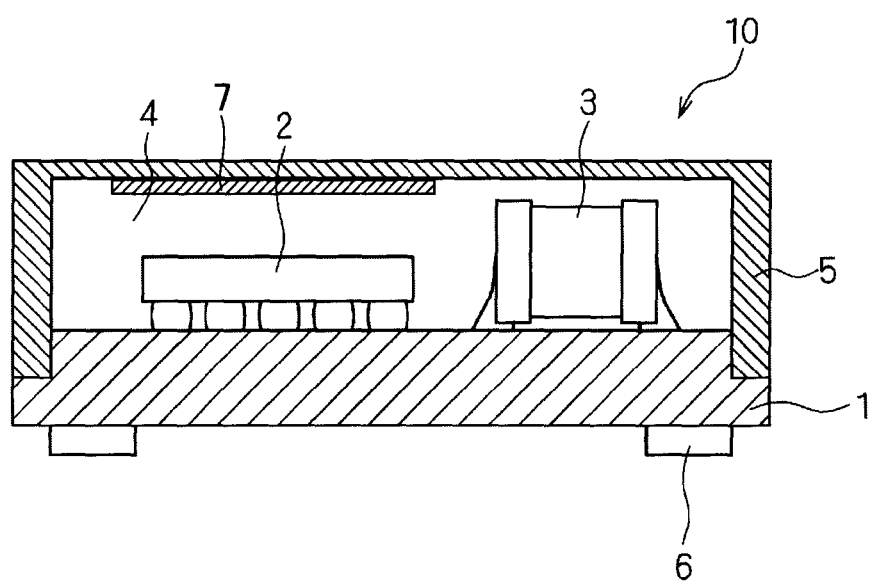
FIG. 3 is a schematic view showing another exemplary structure of the module board according to the embodiment of the present invention.
Figure 4:
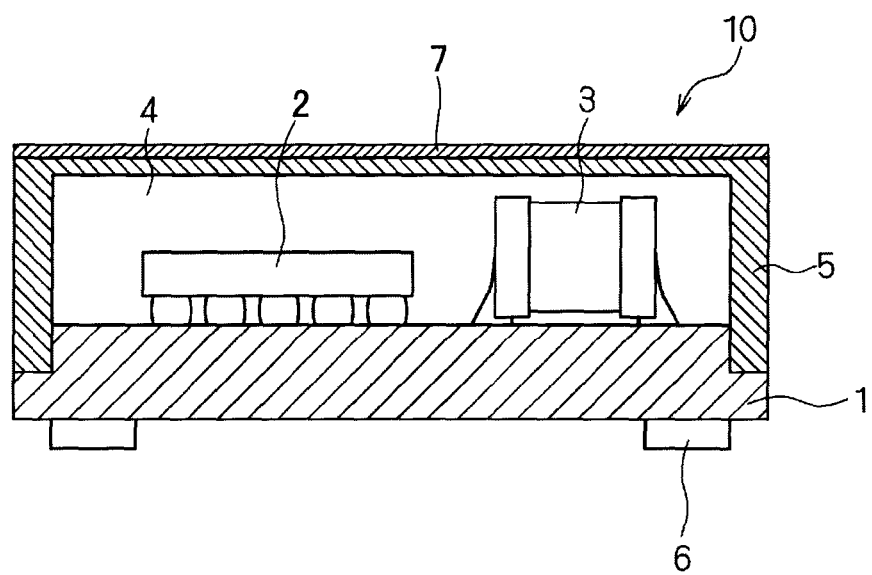
FIG. 4 is a schematic view showing still another exemplary structure of the module board according to the embodiment of the present invention.

Although only a resin film containing carbon as a conductive component is formed as the shield layer 5 in the above-described embodiment, a shield section 7 containing a metal, such as Ag or Cu, as a conductive component may also be partly provided as being in contact with the shield layer 5, as shown in FIGS. 3 and 4, in addition to the resin film containing carbon. As shown in FIG. 3, the shield section 7 may be provided between the sealing resin 4 and the shield layer 5. In this case, it is desirable to dispose the shield section 7 above either one of the electronic components 2 and 3 that is less likely to interfere with the shield section 7. In addition, when the shield section 7 is partly disposed so as to be situated above only a particular electronic component, the adhesion strength between the sealing resin 4 and the shield layer 5 is not considerably reduced. Further, as shown in FIG. 4, the shield section 7 may be disposed along the entire top surface of the shield layer 5. In this case, since the shield section 7 is disposed via the shield layer 5, compared to the case in which the shield layer 5 is not disposed, the interference between the shield section 7 and the electronic components 2 and 3 is suppressed. Further, since the thermal expansion coefficient of the shield section 7 is closer to the thermal expansion coefficient of the shield layer 5 than the thermal expansion coefficient of the sealing resin 4, compared to when the shield section 7 is directly disposed on the sealing resin 4, it is possible to increase the adhesion with respect to the sealing resin 4. However, when the cost reduction and the weight reduction of the module are considered, it is desirable to form the shield section 7 only on the top surface of the shield layer 5, that is, not to form the shield section 7 on the side surfaces. Obviously, the shield section 7 may be formed on the top surface of the shield layer 5 so as to be disposed only above a particular component. The shield section 7 may be formed by, for example, printing, sputtering, or the inkjet method.

The module board according to the present invention is suitable for use in electronic devices in which the module board preferably shields itself from external interfering waves, for example, communication devices.

While a preferred embodiment of the invention has been described above, it is to be understood that variations and modifications will be apparent to those skilled in the art without departing from the scope and spirit of the invention. The scope of the invention, therefore, is to be determined solely by the following claims.

What is claimed is:

1. A module board comprising:
   a base substrate;
   first and second electronic components each mounted on one of principal surfaces of the base substrate;
   a sealing resin formed so as to seal the electronic component mounted on the one of the principal surfaces of the base substrate;
   a shield layer covering the sealing resin; and
   a shield section containing a metal and provided so as to contact with a portion of the shield layer,
   wherein the shield layer is a resin film containing carbon as a conductive component,
   wherein the shield section is provided between the sealing resin and the shield layer, and
   wherein the shield section is disposed only above the first electronic component, and does not extend to an area above the second electronic component.

2. The module board according to claim 1, wherein the sealing resin contains an $SiO_2$ filler.

3. The module board according to claim 2, wherein a coefficient of linear expansion of the shield layer is about 1 to 15 ppm/° C., and
   wherein a coefficient of linear expansion of the sealing resin is about 5 to 20 ppm/° C.

4. The module board according to claim 1, wherein the carbon is flat powder.

5. The module board according to claim 2, wherein the carbon is flat powder.

6. The module board according to claim 3, wherein the carbon is flat powder.

* * * * *